US006188739B1

(12) United States Patent
Everitt et al.

(10) Patent No.: US 6,188,739 B1
(45) Date of Patent: Feb. 13, 2001

(54) MODIFIED THIRD ORDER PHASE-LOCKED LOOP

(75) Inventors: James W. Everitt, Granite Bay; David S. Nack, Roseville; James Parker, Rancho Cordova, all of CA (US)

(73) Assignee: Level One Communications, Inc., Sacramento, CA (US)

( * ) Notice: Under 35 U.S.C. 154(b), the term of this patent shall be extended for 0 days.

(21) Appl. No.: 08/954,914

(22) Filed: Oct. 21, 1997

(51) Int. Cl.[7] .................................. H03D 3/24; H03L 7/06
(52) U.S. Cl. .............................. 375/376; 327/157; 331/17
(58) Field of Search .................................... 375/374, 375, 375/376, 373, 371; 331/17, 18, 25, 1 A; 327/157, 156

(56) References Cited

U.S. PATENT DOCUMENTS

| 3,740,671 | 6/1973 | Crow et al. |
| 4,129,748 | 12/1978 | Saylor . |
| 4,667,168 | 5/1987 | Shiomi et al. |
| 4,712,223 | 12/1987 | Nelson . |
| 4,733,197 | 3/1988 | Chow . |
| 4,791,386 | 12/1988 | Shiga . |
| 4,855,683 | 8/1989 | Troudet et al. |
| 4,906,941 | 3/1990 | Kato et al. |
| 5,008,637 | 4/1991 | Ray . |
| 5,034,748 | 7/1991 | Goedeke et al. |
| 5,057,794 | 10/1991 | Shih . |

FOREIGN PATENT DOCUMENTS

| 0 312 141 | 4/1989 | (EP) . |
| 0 695 038 | 1/1996 | (EP) . |

Primary Examiner—William Luther
(74) Attorney, Agent, or Firm—Merchant & Gould P.C.

(57) ABSTRACT

A phase-locked loop circuit is disclosed which exhibits a wide capture range and a low quality factor (Q) to prevent ringing and improve stability without adding area, increasing power consumption or increasing noise levels. The phase-locked loop includes a comparator to generate an error signal, an oscillator which generates an output signal in response to a control signal and a loop filter which generates the control signal based on the error signal. The loop filter includes a first integrator operatively coupled through a threshold limit detector to a second integrator. The threshold limit detector supplies an electric charge to the second integrator only when the first integrator is proximate to either an upper limit or a lower limit of the first integrator's operating range. The oscillator generates the output signal which tracks the input reference signal frequency as an integer multiple of the input reference signal frequency. The oscillator generates the output signal in response to varying current levels of the control signal. The loop filter further includes a pump-up and a pump-down charge pump that act in tandem under activation by the threshold limit detector. The loop filter includes a duty cycle limiter switch that limits the supply of the charge to the second integrator to a predetermined time period.

10 Claims, 4 Drawing Sheets

MODIFIED THIRD ORDER PHASE-LOCKED LOOP

BACKGROUND OF THE INVENTION

1. Field of the Invention

This invention relates in general to phase-locked loop circuits, and more particularly to a phase-locked loop circuit which exhibits a wide capture range and a low quality factor (Q) to prevent ringing and improve stability.

2. Description of Related Art

Digital data transmission has become increasingly important in the modern communications era. All digital communication systems require some degree of synchronization to incoming signals by receivers. At the heart of all phase synchronization circuits is some version of a phase-locked loop (PLL).

FIG. 1 illustrates a schematic of a basic phase-locked loop circuit 100. Phase-locked loops are servo-control loops, whose controlled parameter is the phase of a locally generated replica of the incoming carrier signal. Phase-locked loops have three basic components: a phase detector 102, a loop filter 104 and a signal-controlled oscillator 106. The phase detector 102 is a device that produces a measure of the difference in phase between an incoming signal 110 and the local replica 120. As the incoming signal 110 and the local replica 120 change with respect to each other, the phase difference 130 (or phase error) becomes a time-varying signal into the loop filter 104. The loop filter 104 governs the response of the phase-locked loop 100 to these variations in the error signal 130. A well-designed phase-locked loop 100 should be able to track changes in the phase of the incoming signal 110, but not be overly responsive to receiver noise. The signal-controlled oscillator 106 is the device that produces the carrier replica 120. The signal-controlled oscillator 106 is an oscillator whose frequency is controlled by a voltage or current level 140 at the input of the signal-controlled oscillator 106.

In many phase-locked loops, the oscillator is driven using a current signal. However, in an IC implementation the center frequency of oscillation varies widely with IC processing. This requires a wide capture range for the phase-locked loop 100, which implies that the control current supplied by the loop filter 104 to the current-controlled oscillator 106 can be high. When the control current of the loop filter 104 is high, the transconductance of transistors in the loop filter that generate the current are also high. In traditional implementations, creating the wide capture range can cause a Q factor which is too high. This high Q causes the phase-locked loop to either ring excessively or become unstable.

A traditional solution for this problem is to use two phase-locked loops whose current- (or voltage-) controlled oscillators are closely matched. However, this increases the area, power, and noise from the extra phase-locked loop.

Thus, there is a need for a phase-locked loop exhibiting a wide capture range and low Q without adding surface area needed to fabricate the phase-locked loop, dramatically increasing the power consumption or increasing noise to the overall phase-locked loop circuit.

SUMMARY OF THE INVENTION

To overcome the limitations in the prior art described above, and to overcome other limitations that will become apparent upon reading and understanding the present specification, the present invention discloses a phase-locked loop circuit which exhibits a wide capture range and a low quality factor (Q) to prevent ringing and improved stability.

The present invention solves the above-described problems by providing a phase-locked loop exhibiting a low Q without adding surface area needed to fabricate the phase-locked loop, dramatically increasing the power consumption and increasing noise to the overall phase-locked loop circuit.

A system in accordance with the principles of the present invention includes a comparator which generates an error signal that represents a difference between an input reference signal and an output replica signal, an oscillator which generates the output replica signal in response to a control signal and a loop filter which generates the control signal based on the error signal such that phase and frequency characteristics of the input reference signal and the output replica signal track together. The loop filter includes a first integrator operatively coupled through a threshold limit detector to a second integrator, and the threshold limit detector includes a mechanism which limits supply of an electric charge to the second integrator when the first integrator is proximate to one of an upper limit and a lower limit of an operating range for the first integrator.

One aspect of the present invention is that the oscillator generates the output replica signal in response to the control signal such that the output replica signal frequency tracks the input reference signal frequency as an integer multiple of the input reference signal frequency.

Another aspect of the present invention is that the oscillator includes a current controlled oscillator which generates the output replica signal in response to varying electric current levels of the control signal.

Another aspect of the present invention is that the loop filter further includes a pair of charge pumps operating in tandem as a pump-up charge pump and a pump-down charge pump, the pair of charge pumps are operatively coupled to the threshold limit detector and the second integrator such that the threshold limit detector activates the pump-up charge pump to supply a positive electric charge to a capacitor within the second integrator when the first integrator is proximate to the upper limit of the operating range for the first integrator and such that the threshold limit detector activates the pump-down charge pump to supply a negative electric charge to a capacitor within the second integrator when the first integrator is proximate to the lower limit of the operating range for the first integrator.

Yet another aspect of the present invention is that the loop filter further includes a duty cycle limiter switch operatively coupled between the pair of charge pumps and the second integrator.

Another aspect of the present invention is that the limiter switch limits the supply of the electric charge to a capacitor within the second integrator to a predetermined time period.

Another aspect of the present invention is that the second integrator has a predetermined transconductance value such that the loop filter operates in a stable operating range.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout:

FIG. 2b illustrates a linearized equivalent circuit 250 for the phase-locked circuit in FIG. 2a;

DETAILED DESCRIPTION OF THE INVENTION

In the following description of the exemplary embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

The present invention provides a third order phase-locked loop circuit which exhibits a wide capture range and a low quality factor (Q) to prevent ringing and improve stability.

Figure 1:
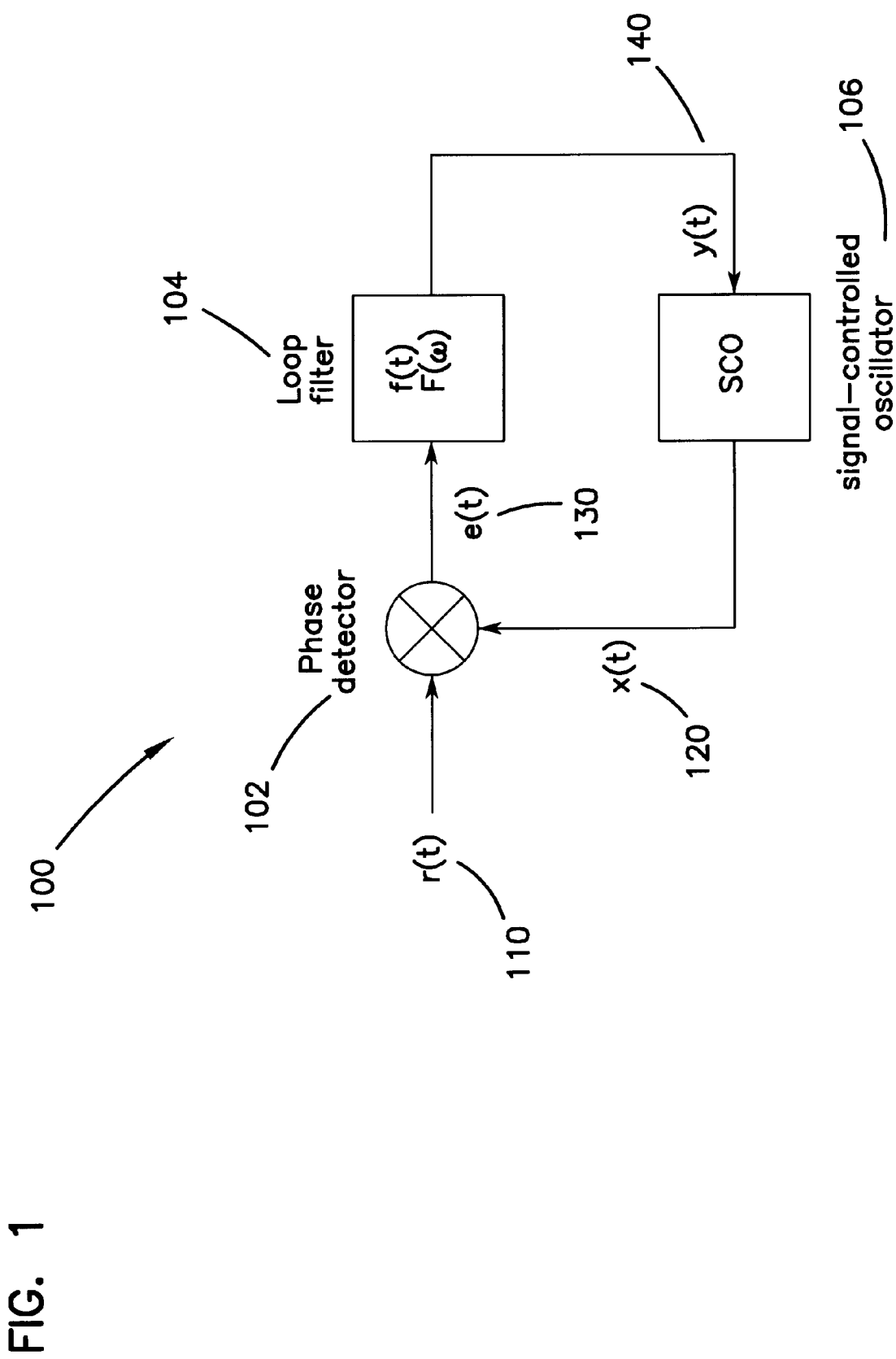
FIG. 1 illustrates a schematic of a basic phase-locked loop circuit.
Figure 2A:
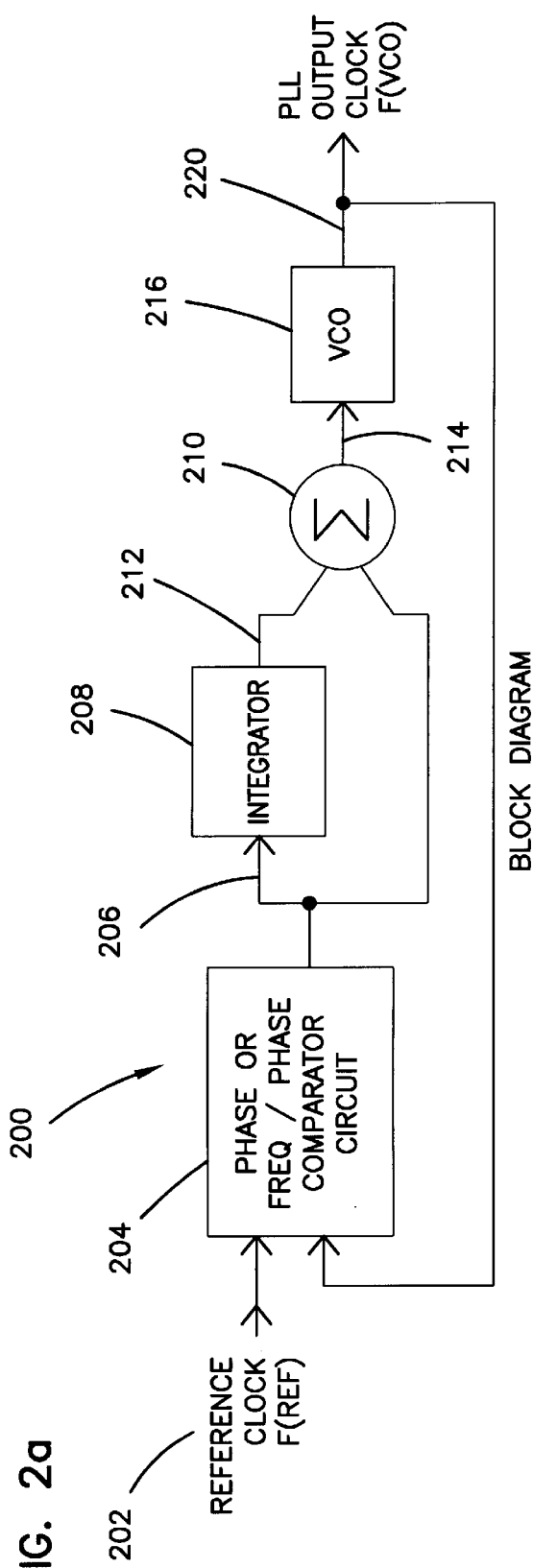
FIG. 2a illustrates a block diagram schematic of a second order phase-locked loop.

FIG. 2a illustrates a block diagram-schematic of a second order phase-locked loop 200. An input signal 202 enters a phase or frequency comparator circuit 204 which compares the output 220 of the phase-locked loop circuit 200 to the input signal 202. The output 206 of the comparator circuit 204 is integrated through an integrator 208. Then a summing circuit 210 takes the output 212 of the integrator 208 and the output 206 of the comparator circuit 204 to generate a signal 214 to drive the signal-controlled oscillator 216. The output 220 of the signal-controlled oscillator 216 is fed back to the comparator circuit 204.

Figure 2B:
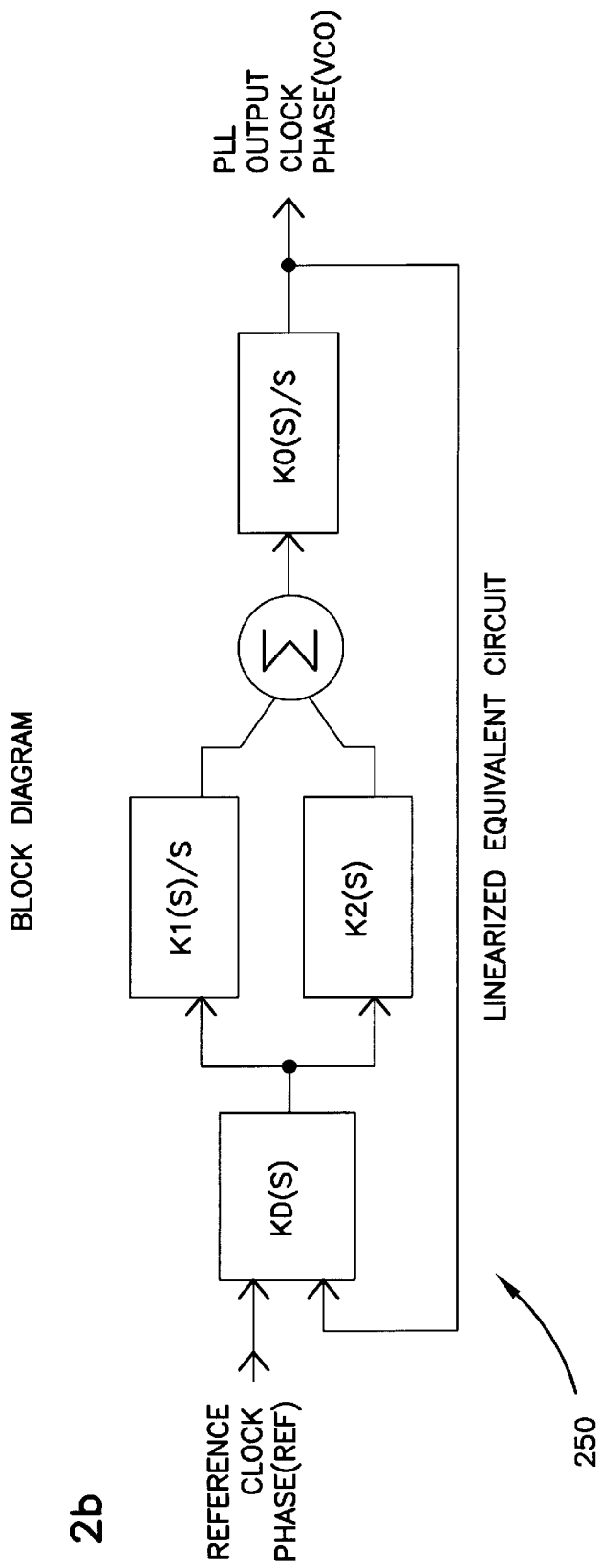

FIG. 2b illustrates a linearized equivalent circuit 250 for the phase-locked circuit 200 in FIG. 2a. The transfer function for this loop as follows:

$$H(S) = \frac{Phase(S)_{VCO}}{Phase(S)_{REF}}$$

$$= \frac{K_D \cdot K_O \cdot (K_2 \cdot S + K_1)}{S^2 + K_D \cdot K_O \cdot K_2 \cdot S + K_D \cdot K_O \cdot K_1};$$

where:

$$H(S) = \frac{Numerator}{S^2 + \frac{w_0 \cdot S}{Q} + w_0^2}$$

and therefore:

$$Q = \frac{\sqrt{K_1}}{K_2 \cdot \sqrt{K_D \cdot K_O}} \text{ and } w_0 = \sqrt{K_D \cdot K_O \cdot K_1}.$$

Figure 3:
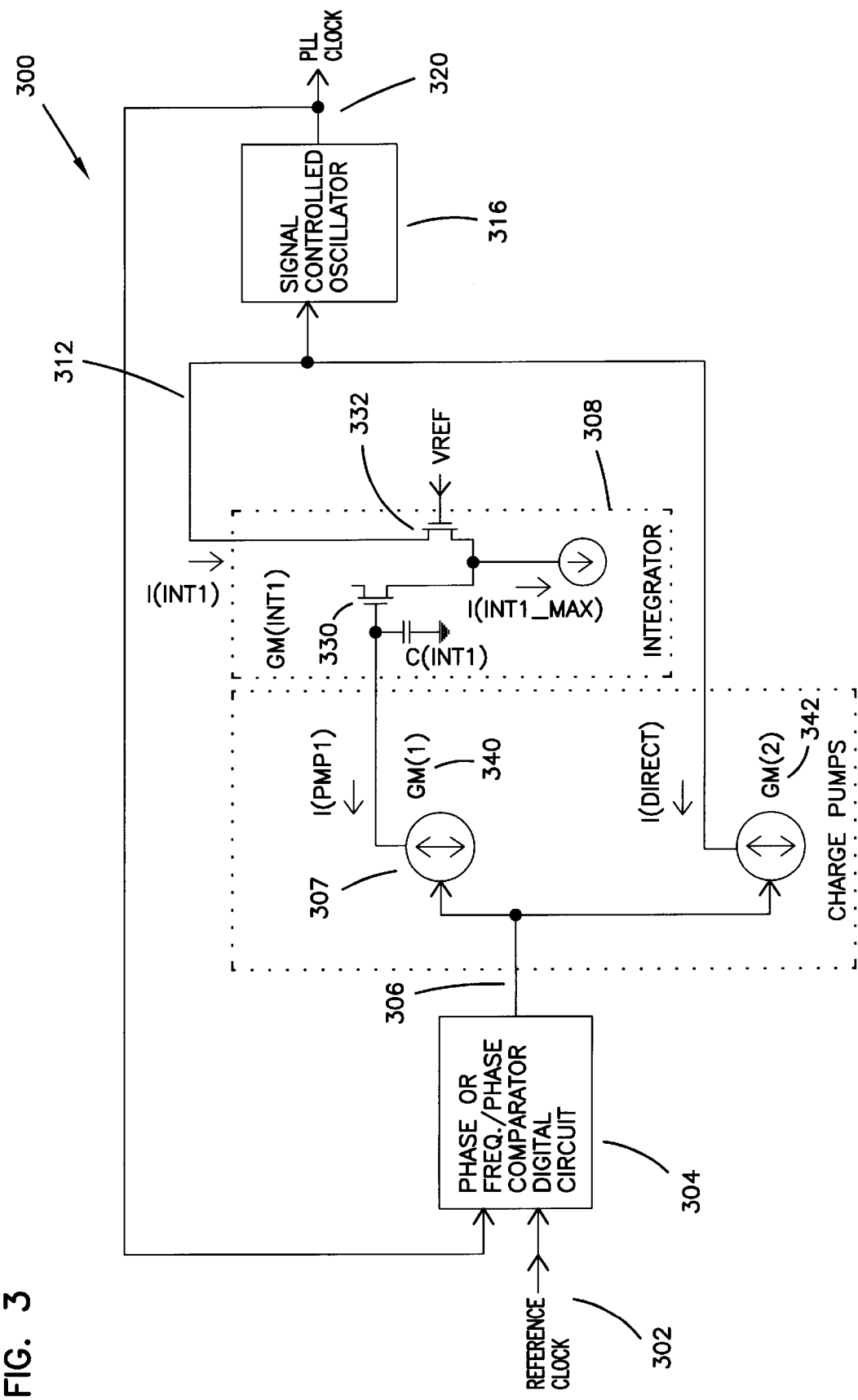
FIG. 3 illustrates a typical circuit implementation of a phase-locked loop circuit according to the block diagrams of FIGS. 2a–b.

FIG. 3 illustrates a typical circuit implementation of a phase-locked loop circuit 300 according to the block diagrams of FIGS. 2a–b. In FIG. 3, an input signal 302 enters a phase or frequency comparator circuit 304 similar to that shown in FIG. 2a. The comparator circuit 304 compares the output 320 of the phase-locked loop circuit 300 to the input signal 302. The output 306 of the comparator circuit 304 passes through a first charge pump 307 and then to an integrator 308 for integration. The output 312 of the integrator 308 and the output 306 of the comparator circuit 304 drive a current-controlled oscillator 316. The output 320 of the current-controlled oscillator 316 is fed back to the comparator circuit 304.

The quality factor represents the ratio of reactance to resistance, i.e., the ratio of the energy stored to energy dissipated per cycle in the circuit. The Q of the circuit illustrated in FIG. 3 is as follows:

$$K_1 = \frac{G_{m1} \cdot G_{mint1}}{C_{int1}};$$

$$K_2 = G_{m2};$$

and $$Q = \frac{\sqrt{G_{m1} \cdot G_{mint1}}}{G_{m2} \cdot \sqrt{K_D \cdot K_O \cdot C_{int1}}}$$

However, as suggested above, this topology exhibits undesirable properties. In many practical current controlled oscillators 316, the center frequency of oscillation varies widely with processing. This requires a wide capture range for the phase-locked loop 300, which implies that the current 312 supplied by the integrator 308 can be high. When the current 312 of the integrator 308 is high, the transconductance of the Field Effect Transistors 330, 332 (FETs) generating this current 312 are also high. Also, in some circuits noise considerations require that transconductance $G_{m2}$ 342 be small, which causes the ratio of the square-root of $G_{m1}$ 340 over $G_{m2}$ 342 to be high. These considerations, coupled with practical limits on $K_d$, $K_o$, and $C_{int1}$, gives a Q which is too high. This high Q causes the phase-locked loop to either ring excessively or become unstable.

Thus, two phase-locked loops that have current- (or voltage-) controlled oscillators which are closely matched are often utilized. The first, less critical loop locks to a reference clock. The control current output of the first, less critical loop is duplicated and fed to the second, more critical phase-locked loop. However, this is undesirable since it adds area, power, and noise from the extra phase-locked loop.

Figure 4:
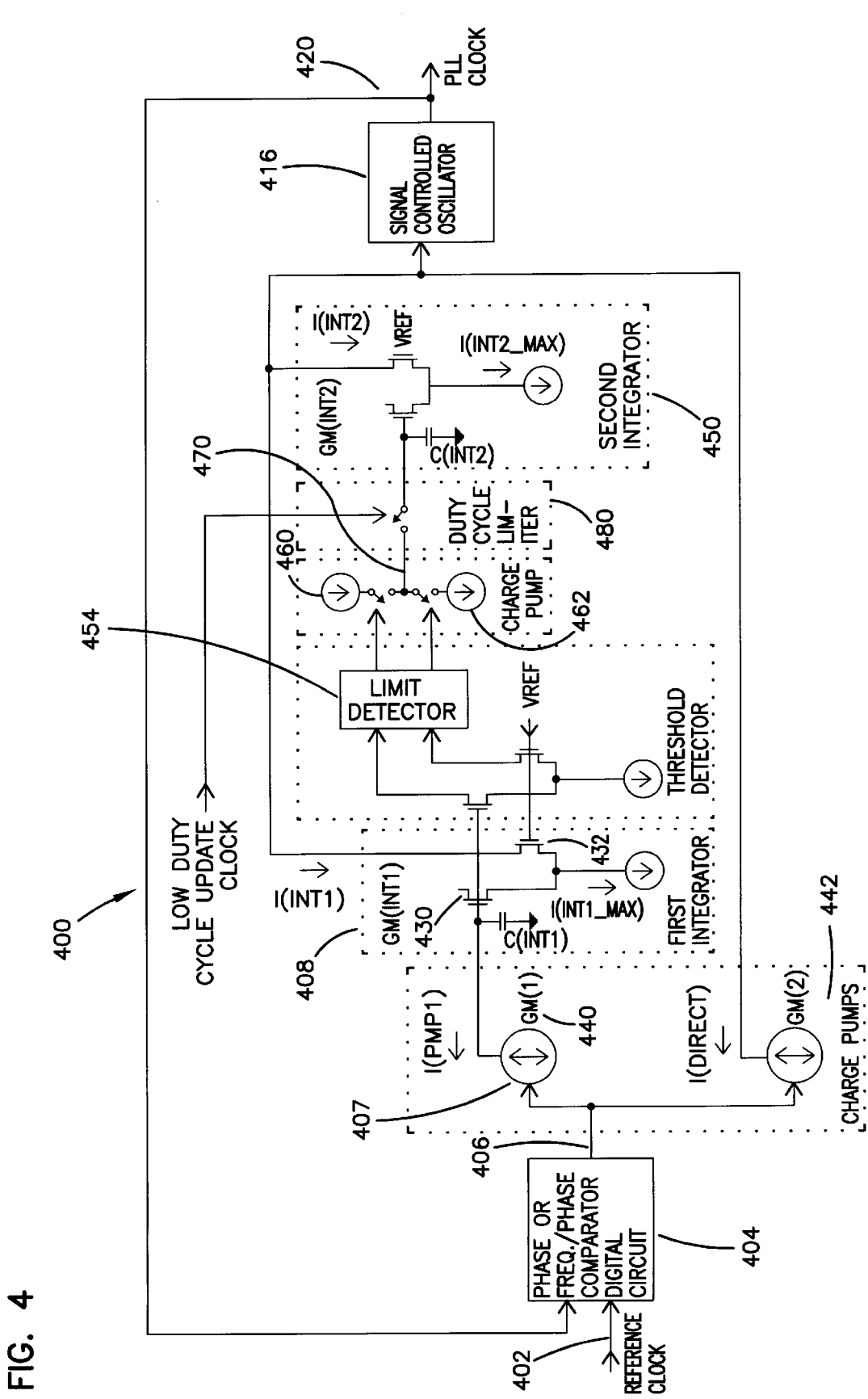
FIG. 4 illustrates a third order phase-locked loop having a low Q factor according to the present invention.

FIG. 4 illustrates a third order phase-locked loop 400 according to the present invention. For the third order phase-locked loop according to the invention as shown in FIG. 4, a second integrator 450 is added. The second integrator 450 forms a modified 3rd order loop. The maximum current available from the first integrator 408 is dramatically reduced and the current from the second integrator 450 is made large enough to drive the current controlled oscillator 416 across its capture range. This allows the transconductance of the first integrator 408 to be dramatically reduced.

If this were a strict 3rd order loop it would merely shift the source of instability from the first integrator 408 to the second integrator 450. However, modifications to the typical operation of the third order loop are made to eliminate merely shifting of the source stability from the first integrator 408 to the second integrator 450.

The first modification involves limiting when the second integrator is updated. According to the present invention, the second integrator 450 is updated only when the first integrator 408 is near the limit of its range. This ensures that the second integrator 450 is not being updated. Thus, the loop stability is not affected when the first integrator 408 is in its normal operating range since the second integrator 450 is not being updated.

This limitation is implemented by attaching a limit detector 454 that activates a pump-up 460 or pump-down 462 charge pump when the first integrator 408 is near the top or bottom of its range respectively.

The second modification involves injecting the charge pump current 470 into the second integrator 450 for only a small fraction of a clock cycle. Occasionally the first integrator 408 will drift far enough toward the positive or negative side of its range to trip the positive or negative output of its limit detector 454, respectively. It is during this period that the charge pump current 470 for the second integrator 450 is injected into the second integrator 450 for only a small fraction of a clock cycle under the control of a duty cycle limiter switch 480.

These two modifications allow the transconductance of the first integrator 408 to be made sufficiently small to ensure that the second integrator 450 does not affect loop stability.

This allows the K1(S) factor of the first integrator 408 to be lowered sufficiently to give a stable phase-locked loop without suffering the stability problems of a true third order phase-locked loop.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A phase locked loop circuit, comprising:
   (a) a comparator which generates an error signal that represents a difference between an input reference signal and an output replica signal;
   (b) an oscillator which generates the output replica signal in response to a control signal; and
   (c) a loop filter, operatively coupled to the comparator and the oscillator, which generates the control signal based on the error signal such that phase and frequency characteristics of the input reference signal and the output replica signal track together, the loop filter comprising a first integrator operatively coupled through a threshold limit detector to a second integrator, the threshold limit detector comprising a mechanism which limits supply of an electric charge to the second integrator when the first integrator is proximate to one of an upper limit and a lower limit of an operating range for the first integrator.

2. The phase locked loop circuit of claim 1 wherein the oscillator generates the output replica signal in response to the control signal such that the output replica signal frequency tracks the input reference signal frequency as an integer multiple of the input reference signal frequency.

3. The phase locked loop circuit of claim 1 wherein the oscillator comprises a current controlled oscillator which generates the output replica signal in response to varying electric current levels of the control signal.

4. The phase locked loop circuit of claim 1 wherein the loop filter further comprises a pair of charge pumps operating in tandem as a pump-up charge pump and a pump-down charge pump, the pair of charge pumps are operatively coupled to the threshold limit detector and the second integrator such that the threshold limit detector activates the pump-up charge pump to supply a positive electric charge to a capacitor within the second integrator when the first integrator is proximate to the upper limit of the operating range for the first integrator and such that the threshold limit detector activates the pump-down charge pump to supply a negative electric charge to a capacitor within the second integrator when the first integrator is proximate to the lower limit of the operating range for the first integrator.

5. The phase locked loop circuit of claim 1 wherein the loop filter further comprises a duty cycle limiter switch operatively coupled between the pair of charge pumps and the second integrator, the limiter switch limiting supply of the electric charge to a capacitor within the second integrator to a predetermined time period.

6. The phase locked loop circuit of claim 1 wherein the second integrator has a predetermined transconductance value such that the loop filter operates in a stable operating range.

7. A phase locked loop circuit, comprising:
   (a) a comparator which generates an error signal that represents a difference between an input reference signal and an output replica signal;
   (b) an oscillator which generates the output replica signal in response to a control signal; and
   (c) a loop filter, operatively coupled to the comparator and the oscillator, which generates the control signal based on the error signal such that phase and frequency characteristics of the input reference signal and the output replica signal track together, the loop filter comprising a first integrator operatively coupled through a threshold limit detector to a pair of charge pumps operating in tandem as a pump-up charge pump and a pump-down charge pump, the pair of charge pumps being operatively coupled through a duty cycle limiter switch to a second integrator, the threshold limit detector comprising a mechanism which activates the pump-up charge pump to supply a positive electric charge to a capacitor within the second integrator when the first integrator is proximate to an upper limit of an operating range for the first integrator, the mechanism activating the pump-down charge pump to supply a negative electric charge to the capacitor within the second integrator when the first integrator is proximate to a lower limit of the operating range for the first integrator, the limiter switch limiting supply of the electric charge to the capacitor within the second integrator to a predetermined time period.

8. The phase locked loop circuit of claim 7 wherein the oscillator generates the output replica signal in response to the control signal such that the output replica signal frequency tracks the input reference signal frequency as an integer multiple of the input reference signal frequency.

9. The phase locked loop circuit of claim 7 wherein the oscillator comprises a current controlled oscillator which generates the output replica signal in response to varying electric current levels of the control signal.

10. The phase locked loop circuit of claim 7 wherein the second integrator has a predetermined transconductance value such that the loop filter operates in a stable operating range.

* * * * *